US012610571B2

(12) United States Patent (10) Patent No.: US 12,610,571 B2
Kawai et al. (45) Date of Patent: Apr. 21, 2026

(54) DIODE, POWER RECEPTION DEVICE AND POWER TRANSMISSION SYSTEM

(71) Applicant: SANKEN ELECTRIC CO., LTD., Niiza (JP)

(72) Inventors: Hiroji Kawai, Oyama (JP); Shuichi Yagi, Oyama (JP); Hironobu Narui, Oyama (JP)

(73) Assignee: SANKEN ELECTRIC CO., LTD., Niiza (JP)

( * ) Notice: Subject to any disclaimer, the term of this patent is extended or adjusted under 35 U.S.C. 154(b) by 443 days.

(21) Appl. No.: 18/285,464

(22) PCT Filed: Mar. 7, 2022

(86) PCT No.: PCT/JP2022/009592
§ 371 (c)(1),
(2) Date: Oct. 3, 2023

(87) PCT Pub. No.: WO2023/276282
PCT Pub. Date: Jan. 5, 2023

(65) Prior Publication Data
US 2024/0194798 A1 Jun. 13, 2024

(30) Foreign Application Priority Data
Jun. 29, 2021 (JP) ................................. 2021-107207

(51) Int. Cl.
*H10D 8/60* (2025.01)
*H10D 8/01* (2025.01)
(Continued)

(52) U.S. Cl.
CPC .............. *H10D 8/60* (2025.01); *H10D 8/051* (2025.01); *H10D 8/053* (2025.01);
(Continued)

(58) Field of Classification Search
CPC .......... H10D 8/051; H10D 8/053; H10D 8/60; H10D 62/10; H10D 62/824; H10D 62/8503; H10D 62/854
See application file for complete search history.

(56) References Cited

U.S. PATENT DOCUMENTS

2004/0124500 A1* 7/2004 Kawagoe ............. H10H 20/825
257/101
2011/0243172 A1* 10/2011 Lin ........................ B82Y 20/00
438/47
(Continued)

FOREIGN PATENT DOCUMENTS

JP 2008091394 A 4/2008
JP 2014157993 A 8/2014
(Continued)

OTHER PUBLICATIONS

International Search Report from corresponding PCT application PCT/JP2022/009592, dated May 24, 2022.
(Continued)

*Primary Examiner* — Scott B Geyer
(74) *Attorney, Agent, or Firm* — K&L Gates LLP

(57) ABSTRACT

This diode has an undoped GaN layer 11, an $Al_xGa_{1-x}N$ layer ($0<x<1$) 12 thereon, a Mg-doped p-type $In_yGa_{1-y}N$ layer ($0<y<1$) 13 having an island-like shape thereon, a metal electrode 14 thereon, an anode electrode 15 which is provided on the $Al_xGa_{1-x}N$ layer 12 and which is electrically connected to the metal electrode 14 and a cathode electrode 16 which is provided on a part of the $Al_xGa_{1-x}N$ layer 12 which is located on the opposite side from the anode electrode 15 with respect to the p-type $In_yGa_{1-y}N$ layer 13. In this diode, at a non-operating time, a two-dimensional electron gas 17 is formed in the undoped GaN layer 11 in the vicinity part of a hetero-interface between the $Al_xGa_{1-x}N$
(Continued)

layer 12 and the undoped GaN layer 11 except a part below the p-type $In_yGa_{1-y}N$ layer 13.

4 Claims, 12 Drawing Sheets

(51) Int. Cl.
    *H10D 62/824*     (2025.01)
    *H10D 62/85*     (2025.01)
    *H10D 62/854*     (2025.01)
(52) U.S. Cl.
    CPC ....... *H10D 62/824* (2025.01); *H10D 62/8503* (2025.01); *H10D 62/854* (2025.01)

(56) References Cited

U.S. PATENT DOCUMENTS

| | | | | |
|---|---|---|---|---|
| 2014/0203287 A1* | 7/2014 | Zhang | ................ | H10H 20/8162 |
| | | | | 438/22 |
| 2016/0093691 A1* | 3/2016 | Echigoya | ............. | H10D 62/111 |
| | | | | 257/76 |
| 2018/0145166 A1* | 5/2018 | Umeda | ................ | H10D 64/519 |
| 2020/0066849 A1* | 2/2020 | Then | ....................... | H10D 8/053 |
| 2021/0134962 A1* | 5/2021 | Kimura | ................... | C30B 29/38 |
| 2021/0143264 A1* | 5/2021 | Cheng | ............... | H10D 30/4732 |
| 2021/0296449 A1* | 9/2021 | Rajan | ..................... | H01L 21/22 |
| 2022/0115528 A1* | 4/2022 | Atmaca | ................ | H10D 62/343 |
| 2022/0130988 A1* | 4/2022 | Fareed | ............... | H10D 30/4755 |
| 2022/0199822 A1* | 6/2022 | Hao | ...................... | H10D 62/114 |
| 2022/0230883 A1* | 7/2022 | Chowdhury | ......... | H10D 30/668 |
| 2023/0170407 A1* | 6/2023 | Kawai | ................... | H10D 30/475 |
| | | | | 257/76 |
| 2025/0380541 A1* | 12/2025 | Nishimura | .......... | H10D 62/402 |

FOREIGN PATENT DOCUMENTS

| | | |
|---|---|---|
| JP | 2014160761 A | 9/2014 |
| JP | 2015198175 A | 11/2015 |
| JP | 2020191425 A | 11/2020 |

OTHER PUBLICATIONS

Mizutani et al.; "AIGaN/GaN HEMTs With Thin InGaN Cap Layer for Normally Off Operation"; IEEE Electron Device Letters, vol. 28, No. 7, Jul. 2007, pp. 549-551. (3 pages.).

Harauchi et al.; "Non-Contact Microwave Power Transmission Using GaN SBD and Open-Ring Resonator Coupling"; The Institute of Electronics, Information and Communication Engineers Technical Report; WPT2011-27 (Mar. 2012). (6 pages.).

Office action issued in corresponding Japanese Patent Application No. 2021-107207, dated Sep. 22, 2021. (3 pages.).

Office action issued in corresponding Japanese Patent Application No. 2021-107207, dated Nov. 12, 2021. (3 pages.).

\* cited by examiner

ELECTRON ENERGY

2DEG $E_C$ $E_F$ $Al_xGa_{1-x}N$ LAYER

GaN LAYER

ELECTRON ENERGY

2DEG17 DEPLETED $E_C$

+  −

$E_F$

METAL ELECTRODE 14    $Al_xGa_{1-x}N$ LAYER 12

UNDOPED GaN LAYER 11 p-TYPE $In_yGa_{1-y}N$ LAYER 13

CONVENTIONAL GaN-BASED SCHOTTKY DIODE
$V_{on}=1.0[V]$

PRESENT GaN-BASED DIODE
$0[V]<V_{on}<1.0[V]$

DIODE, POWER RECEPTION DEVICE AND POWER TRANSMISSION SYSTEM

TECHNICAL FIELD

The present invention relates to a diode, a power reception device and a power transmission system, and more particularly to a diode using gallium nitride (GaN)-based semiconductor which is suitably used as a rectifier diode for a high-frequency radio wave, a power reception device and a power transmission system which use the diode as a rectifier diode.

BACKGROUND ART

There has been known a technology in which a high-frequency radio wave is converted to direct current and power is produced. One method of this technology is a rectenna (abbreviation of rectifying-antenna) method. The rectenna circuit is configured by an antenna, a matching circuit and a rectifier diode.

Application of the rectenna technology includes power reception on the earth side in space solar power generation, power reception rectifying circuit of an RFID tag for physical distribution, power reception of a non-contact type IC card, power regeneration of devices using high power microwave, high-sensivity detection of millimeter wave and terahertz wave and the like.

Conventionally, Schottky diodes using GaN-based semiconductor have been known as diodes for the rectenna circuit (non-patent literature 1). The Schottky diodes are finger-shaped (stripe-shaped) Schottky diodes. In the finger-shaped Schottky diode, an $n^+$-type GaN layer is stacked as an access layer on a semi-insulating SiC substrate and an n-type GaN layer as a finger-shaped active layer is stacked thereon. A finger-shaped anode electrode is in Schottky contact with the active layer. A finger-shaped cathode electrode is in ohmic contact with the access layer on the both sides of the active layer.

In the finger-shaped Schottky diode described above, there is a problem that an access region from the cathode electrode to the active layer, i.e., the access layer exists in addition to the active layer near the anode electrode playing an important role in rectifying characteristic and its resistance increases on resistance. Among resistances contributing to the on resistance, the resistance of the part of the active layer can not be freely determined depending on frequency used or voltage resistance. However, it is desired to decrease the resistance of the access layer as small as possible to decrease the on resistance. It is not possible to use the high voltage-resistant structure increasing capacitance such as field plates because it is necessary to keep parasitic capacitance small to increase the voltage resistance.

To solve such subjects, there have been proposed Schottky diodes described in patent literatures 1, 2. The Schottky diode described in patent literature 1 has an anode electrode and a cathode electrode provided on one side of a GaN-based semiconductor layer. The anode electrode is divided into a plurality of sections. Each anode electrode divided is mutually connected by metal wires and is surrounded by the cathode electrode and each anode electrode divided has a shape with the aspect ratio not larger than 5. The Schottky diode described in patent literature 2 has a GaN-based semiconductor layer and an anode electrode provided on the GaN-based semiconductor layer to be in Schottky contact with the GaN-based semiconductor layer.

The anode electrode has a TiN layer provided on the GaN-based semiconductor layer to be in contact with the GaN-based semiconductor layer, an adhesion layer made of metal capable of Schottky contact with the GaN-based semiconductor layer provided on the TiN layer to be in contact with the TiN layer and a metal layer for decreasing resistance provided on the adhesion layer to be in contact with the adhesion layer.

PRIOR ART LITERATURE

Patent Literature

[PATENT LITERATURE 1] Gazette of U.S. Pat. No. 5,828,435 5995234
[PATENT LITERATURE 2] Gazette of U.S. Pat. No. 5,669,119 5678341

Non-Patent Literature

[NON-PATENT LITERATURE 1] Harauchi et al., "Non-Contact Microwave Power Transmission Using GaN SBD and Open-Ring Resonator Coupling", IEICE Technical report, WPT2011-27(2012-03)
[NON-PATENT LITERATURE 2] Mizutani et al., "AlGaN/GaN HEMTs with thin InGaN cap layer for normally-off operation", IEEE Electron Device Letters, Vol. 28, No. 7, pp. 549-551, July (2007)

SUMMARY OF INVENTION

Subjects to be Solved by Invention

However, according to consideration by the present inventors, regarding the conventional finger-shaped Schottky diode described in non-patent literature 1 and Schottky diodes described in patent literatures 1, 2, there is still room for improvement in efficiency and operation speed.

Therefore, the subject to be solved by the invention is to provide a diode with high efficiency and high speed.

Another subject to be solved by the invention is to provide a high performance power reception device and a power transmission system using the diode as a rectifier diode for a high-frequency radio wave.

Means To Solve The Subjects

In order to solve the subject, according to the invention, there is provided a diode, comprising:

an undoped GaN layer, an $Al_xGa_{1-x}N$ layer ($0<x<1$) on the undoped GaN layer, a Mg-doped p-type $In_yGa_{1-y}N$ layer ($0<y<1$) having an island-like shape on the $Al_xGa_{1-x}N$ layer, a metal electrode on the p-type $In_yGa_{1-y}N$ layer, an anode electrode which is provided on the $Al_xGa_{1-x}N$ layer and which is electrically connected to the metal electrode; and a cathode electrode which is provided on a part of the $Al_xGa_{1-x}N$ layer which is located on the opposite side from the anode electrode with respect to the p-type $In_yGa_{1-y}N$ layer.

In the diode, at a non-operating time (thermal equilibrium state), i.e., at 0 [V]-bias, a two-dimensional electron gas is formed in the undoped GaN layer in the vicinity part of a hetero-interface between the $Al_xGa_{1-x}N$ layer and the undoped GaN layer except a part below the p-type $In_yGa_{1-y}N$ layer (active region). In other words, the two-dimensional electron gas formed in the undoped GaN layer in the vicinity part of the hetero-interface between the $Al_xGa_{1-x}N$ layer and the undoped GaN layer is depleted in the part below the p-type $In_yGa_{1-y}N$ layer (the concentration of the two-dimensional electron gas is almost 0 ($<10^{11}$ [$cm^{-2}$])). Therefore, as will be described later in details, it is possible to greatly decrease the capacitance of the diode because the capacitance of the diode is only the fringe capacitance. When the forward turn-on voltage (on voltage) of the diode is denoted as $V_{on}$, 0 [V]$<V_{on}<1.0$ [V] can be realized. When the voltage not smaller than $V_{on}$ is not applied to the anode electrode for the cathode electrode, the two-dimensional electron gas is depleted in the part below the p-type $In_yGa_{1-y}N$ layer and therefore the diode is off. When the voltage not smaller than $V_{on}$ is applied to the anode electrode for the cathode electrode, the two-dimensional electron gas is induced in the part just below the p-type $In_yGa_{1-y}N$ layer (active region) and therefore a channel made of the two-dimensional electron gas is formed so as to connect the anode electrode and the cathode electrode and the diode is turned on.

In the diode, when the thickness of the $Al_xGa_{1-x}N$ layer is denoted as $t_{Al}$, the thickness of the p-type $In_yGa_{1-y}N$ layer is denoted as $t_{In}$ and the Mg concentration of the p-type $In_yGa_{1-y}N$ layer id denoted as [Mg], typically, $$0.1<x<0.3$$

$$10 \text{ [nm]}<t_{Al}<40\text{[nm]}$$

$$0.05<y<0.25$$

$$2 \text{ [nm]}<t_{In}<20\text{[nm]}$$

$$1\times10^{19}\text{[cm}^{-3}\text{]}<\text{[Mg]}<1\times10^{21}\text{[cm}^{-3}\text{]}$$

are satisfied, but not limited to this. The reason for selecting x and $t_{Al}$ as described above is generally as follows. That is, the concentration of the two-dimensional electron gas formed in the undoped GaN layer in the vicinity part of the hetero-interface between the $Al_xGa_{1-x}N$ layer and the undoped GaN layer is primarily (if the surface effect is ignored) determined by polarization charge. In a typical example, when x=0.25 and $t_{Al}$=25 [nm], the concentration of the two-dimensional electron gas is about $10^{13}$ [$cm^{-2}$]. When 0.1$<$x$<$0.3 and 10 [nm]$<t_{Al}<$40 [nm] are satisfied, it is possible to obtain the concentration of the two-dimensional electron gas as the same as described above. The reason for selecting y, $t_{In}$ and [Mg] as described above is generally as follows. That is, the p-type $In_yGa_{1-y}N$ layer has the solubility limit of In and mismatch of lattice constants with the $Al_xGa_{1-x}N$ layer and therefore y and $t_{In}$ are limited by the gross quantity of In in the layer. Experimentally, the gross quantity of In is not larger than 0.25 (25 [%])×5 [nm]. This condition is satisfied by setting 0.05$<$y$<$0.25 and 2 [nm] $<t_{In}<$20 [nm]. Doping quantity of Mg into GaN and $Al_xGa_{1-x}N$ is practically smaller than about $1\times10^{21}$ [$cm^{-3}$] at most and doping quantity of Mg into $In_yGa_{1-y}N$ is also the same. Doping of Mg above this level invites segregation of Mg and Mg appears in the layer or the surface. On the other hand, if doping quantity of Mg is smaller than $1\times10^{19}$ [$cm^{-3}$], the sheet resistance of the p-type $In_yGa_{1-y}N$ layer becomes too high. Therefore, the Mg concentration is set to $1\times10^{19}$ [$cm^{-3}$]$<$[Mg]$<1\times10^{21}$ [$cm^{-3}$].

The $Al_xGa_{1-x}N$ layer is typically undoped, though the $Al_xGa_{1-x}N$ layer may be an n-type or a p-type $Al_xGa_{1-x}N$ layer doped with donors (n-type impurities) or acceptors (p-type impurities), for example, a Si-doped n-type $Al_xGa_{1-x}N$ layer.

The anode electrode and the cathode electrode are in contact with the two-dimensional electron gas which is formed in the undoped GaN layer in the vicinity part of the hetero-interface between the $Al_xGa_{1-x}N$ layer and the undoped GaN layer. The metal electrode on the p-type $In_yGa_{1-y}N$ layer is in contact with the p-type $In_yGa_{1-y}N$ layer. The anode electrode may be provided such that it extends from the $Al_xGa_{1-x}N$ layer on the metal electrode, or may be provided on only the $Al_xGa_{1-x}N$ layer. In the latter case, the metal electrode on the p-type $In_yGa_{1-y}N$ layer is provided such that it extends on the anode electrode. Here, the metal electrode electrically connected to the anode electrode acts as a part of the anode electrode.

Further, according to the invention, there is provided a power reception device, comprising:

a power reception circuit for receiving a high-frequency radio wave, the power reception circuit having a rectifier diode for converting a high-frequency radio wave into direct current, the rectifier diode being a diode, comprising:

an undoped GaN layer, an $Al_xGa_{1-x}N$ layer (0$<$x$<$1) on the undoped GaN layer, a Mg-doped p-type $In_yGa_{1-y}N$ layer (0$<$y$<$1) having an island-like shape on the $Al_xGa_{1-x}N$ layer, a metal electrode on the p-type $In_yGa_{1-y}N$ layer, an anode electrode which is provided on the $Al_xGa_{1-x}N$ layer and which is electrically connected to the metal electrode; and a cathode electrode which is provided on a part of the $Al_xGa_{1-x}N$ layer on the opposite side from the anode electrode with respect to the p-type $In_yGa_{1-y}N$ layer, the anode electrode being provided such that the anode electrode extends from the $Al_xGa_{1-x}N$ layer on the metal electrode.

Further, according to the invention, there is provided a power transmission system, comprising:

a power transmission circuit for transmitting a high-frequency radio wave; and a power reception circuit for receiving a high-frequency radio wave, the power reception circuit having a rectifier diode for converting a high-frequency radio wave into direct current, the rectifier diode being a diode, comprising:

an undoped GaN layer, an $Al_xGa_{1-x}N$ layer (0$<$x$<$1) on the undoped GaN layer, a Mg-doped p-type $In_yGa_{1-y}N$ layer (0$<$y$<$1) having an island-like shape on the $Al_xGa_{1-x}N$ layer, a metal electrode on the p-type $In_yGa_{1-y}N$ layer, an anode electrode which is provided on the $Al_xGa_{1-x}N$ layer and which is electrically connected to the metal electrode; and a cathode electrode which is provided on a part of the $Al_xGa_{1-x}N$ layer on the opposite side from the anode electrode with respect to the p-type $In_yGa_{1-y}N$ layer, the anode electrode being provided such that the anode electrode extends from the $Al_xGa_{1-x}N$ layer on the metal electrode.

In the invention of the power reception device and the invention of the power transmission system, other than the above, the explanation concerning the above invention of the diode comes into effect unless it is contrary to its character.

Effect of the Invention

According to the invention, it is possible to realize a diode with ultrahigh speed due to drastic improvement of operation speed by drastic decrease of the capacitance of the active region and its vicinity and with high efficiency due to lowering the forward turn-on voltage than the conventional GaN-based Schottky diode. And, by using the high efficiency and ultrahigh speed diode as a rectifier diode, it is possible to realize a high performance power reception device and a power transmission system.

MODES FOR CARRYING OUT THE INVENTION

Modes for carrying out the invention (hereinafter referred as embodiments) will now be explained below.

The First Embodiment

[The GaN-Based Diode]

Figure 1:
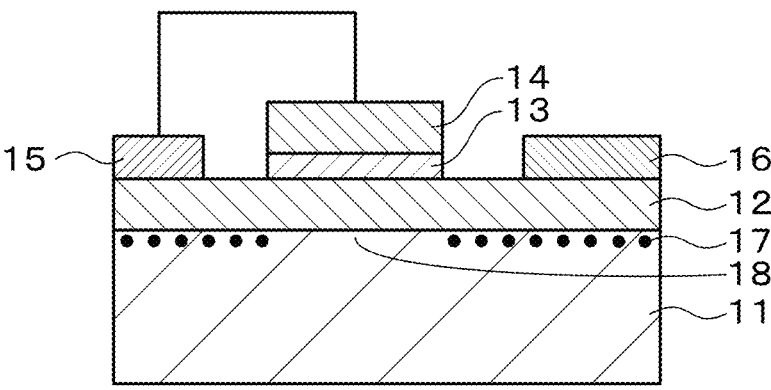
FIG. 1A cross-sectional view showing the basic structure of a GaN-based diode according to a first embodiment of the invention.

The GaN-based diode according to the first embodiment is described. FIG. 1 shows the basic structure of the GaN-based diode.

As shown in FIG. 1, in the GaN-based diode, an undoped GaN layer 11, an $Al_xGa_{1-x}N$ layer 12 and a p-type $In_yGa_{1-y}N$ layer 13 doped with Mg are stacked in order. The thickness of the undoped GaN layer 11 is selected as necessary, typically selected to be not smaller than 1 [μm] and not larger than 2.5 [μm] (for example, 2 [μm]). The Al composition x of the $Al_xGa_{1-x}N$ layer 12 is typically $0.1<x<0.3$ (for example, 0.21). The thickness $t_{Al}$ of the $Al_xGa_{1-x}N$ layer 12 is typically 10 [nm]$<t_{Al}<$40 [nm] (for example, 20 [nm]). The $Al_xGa_{1-x}N$ layer 12 is typically undoped, though the $Al_xGa_{1-x}N$ layer 12 may be an n-type or a p-type $Al_xGa_{1-x}N$ layer doped with donors (n-type impurities) or acceptors (p-type impurities). The p-type $In_yGa_{1-y}N$ layer 13 has a finger-like (stripe-like) planar shape extending in a direction. The finger length $L_g$ of the p-type $In_yGa_{1-y}N$ layer 13 is selected as necessary and is, for example, not smaller than 0.5 [μm] and not larger than 2 [μm] (for example, 1 [μm]). The In composition y of the p-type $In_yGa_{1-y}N$ layer 13 is typically $0.05 < y < 0.25$ (for example, 0.2). The thickness $t_{In}$ of the p-type $In_yGa_{1-y}N$ layer 13 is typically 2 [nm]$< t_{In} <$20 [nm] (for example, 5 [nm]). The Mg concentration [Mg] of the p-type $In_yGa_{1-y}N$ layer 13 is typically $1×10^{19}$ [cm$^{-3}$]$<$ [Mg]$<1×10^{21}$ cm$^{-3}$ (for example, $1×10^{20}$ [cm$^{-3}$]).

Figure 2:
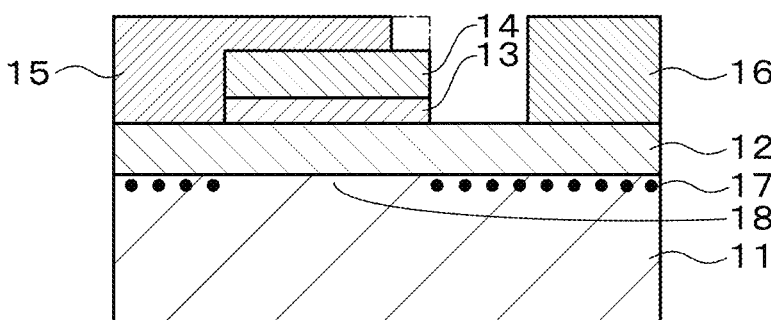
FIG. 2A cross-sectional view showing a specific example of the way of connection between the anode electrode and the metal electrode of the GaN-based diode according to the first embodiment of the invention.
Figure 3:
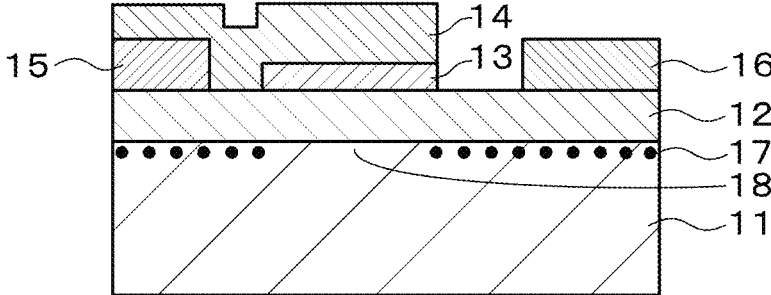
FIG. 3A cross-sectional view showing another example of the way of connection between the anode electrode and the metal electrode of the GaN-based diode according to the first embodiment of the invention.

A metal electrode 14 is provided on the p-type $In_yGa_{1-y}N$ layer 13 such that it is in ohmic contact with the p-type $In_yGa_{1-y}N$ layer 13. The metal electrode 14 may be basically any as far as it is in ohmic contact with the p-type $In_yGa_{1-y}N$ layer 13 and is made of, for example, a Ti/Ni layered film, a Ti/Ni/Au layered film, a Ti/Pd layered film and the like. An anode electrode 15 is provided on a part of the $Al_xGa_{1-x}N$ layer 12 on one side with respect to the p-type $In_yGa_{1-y}N$ layer 13 such that it is electrically connected to the metal electrode 14. Further, a cathode electrode 16 is provided on a part of the $Al_xGa_{1-x}N$ layer 12 on the opposite side from the anode electrode 15 with respect to the p-type $In_yGa_{1-y}N$ layer 13. Connection between the anode electrode 15 and the metal electrode 14 may be arbitrarily carried out. Its specific examples are shown in FIG. 2 and FIG. 3. In the example shown in FIG. 2, the anode electrode 15 is provided such that it extends from the $Al_xGa_{1-x}N$ layer 12 on the metal electrode 14. In this case, the anode electrode 15 may extend on a part of the metal electrode 14, or may extend on the whole of the metal electrode 14 as shown in a dashed-and-dotted line of FIG. 2. In the example shown in FIG. 3, the metal electrode 14 extends on the anode electrode 15 through the $Al_xGa_{1-x}N$ layer 12.

In the GaN-based diode, at a non-operating time (thermal equilibrium state), a two-dimensional electron gas (2DEG) 17 is formed in the undoped GaN layer 12 in the vicinity part of the hetero-interface between the undoped GaN layer 11 and the $Al_xGa_{1-x}N$ layer 12. In a part just below the p-type $In_yGa_{1-y}N$ layer 13, the 2DEG 17 is depleted and its concentration is about 0 (for example, $<1×10^{11}$ (cm$^{-2}$) to form a depletion region 18. The anode electrode 15 and the cathode electrode 16 are in ohmic contact with the 2DEG 17 via the $Al_xGa_{1-x}N$ layer 12. The anode electrode 15 and the cathode electrode 16 may be basically any as far as they are in ohmic contact with the 2DEG 17 and is made of, for example, a Ti/Al/Au layered film, a Ti/Al/Ni/Au layered film and the like.

Figure 4A:
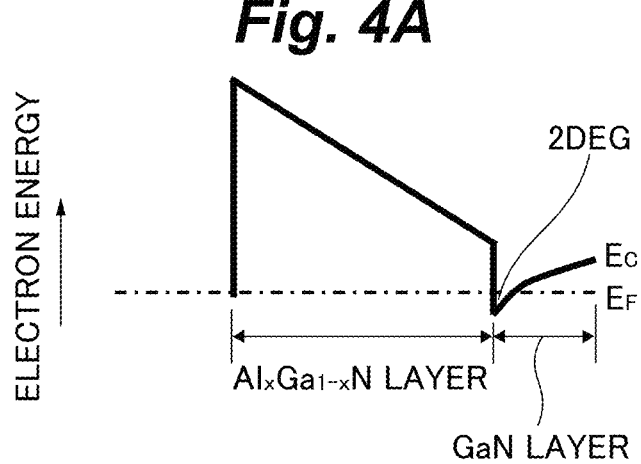
FIG. 4A The energy band diagram of a conventional GaN-based Schottky diode for comparison with the energy band diagram of the GaN-based diode according to the first embodiment of the invention.
Figure 4B:
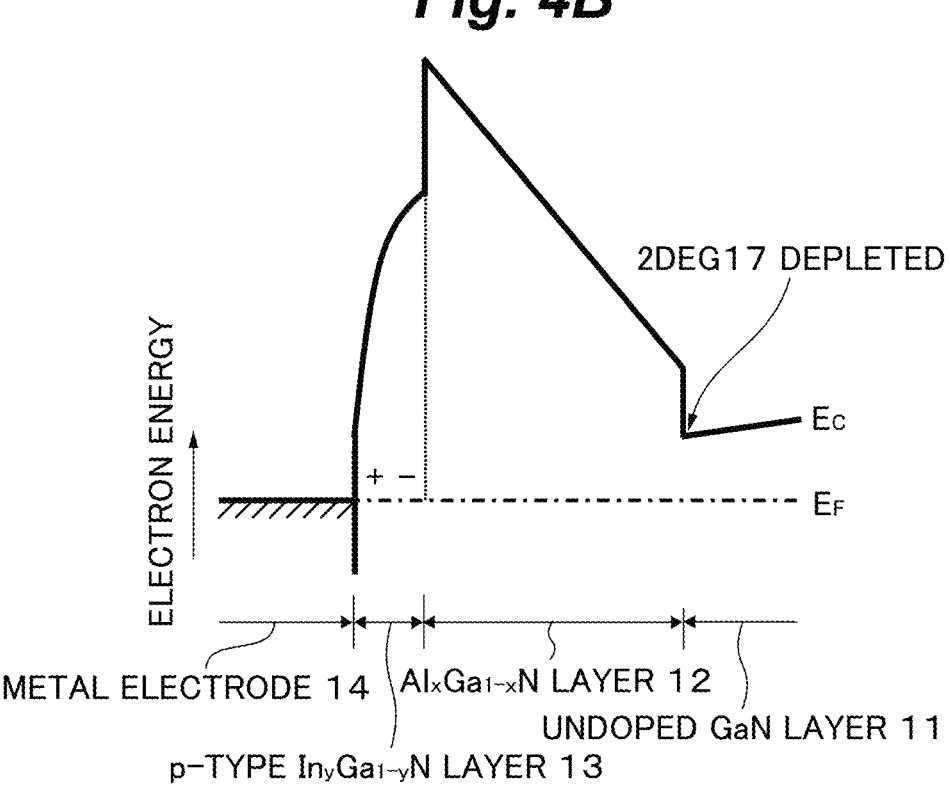
FIG. 4B The energy band diagram of the GaN-based diode according to the first embodiment of the invention.

The reason why the 2DEG 17 is depleted in the part just below the p-type $In_yGa_{1-y}N$ layer 13 is as follows. FIG. 4A shows a qualitative conduction band of a general $Al_xGa_{1-x}/$ GaN HEMT (High Electron Mobility Transistor) and $E_c$ denotes energy of the bottom end of the conduction band and EF denotes Fermi energy. As shown in FIG. 4A, a 2DEG is formed in the GaN layer in the vicinity part of the $Al_xGa_{1-x}/$GaN hetero-interface due to the effect of the polarization difference of the $Al_xGa_{1-x}/$GaN hetero-interface. On the other hand, FIG. 4B shows a conduction band of the GaN-based diode. As shown in FIG. 4B, in the GaN-based diode, the p-type $In_yGa_{1-y}N$ layer 13 is provided on the $Al_xGa_{1-x}N$ layer 12. The effect of the p-type $In_yGa_{1-y}N$ layer 13 is described (non-patent literature 2). The direction of the piezopolarization of the heterojunction between the p-type $In_yGa_{1-y}N$ layer 13 and the $Al_xGa_{1-x}N$ layer 12 is opposite to the direction of the piezopolarization of the heterojunction between the $Al_xGa_{1-x}N$ layer 12 and the undoped GaN layer 11. Therefore, by adding the p-type $In_yGa_{1-y}N$ layer 13 to the surface of the $Al_xGa_{1-x}N$ layer 12, the conduction band is lifted up and this acts to decrease the concentration of the 2DEG 17. This is shown in FIG. 4B as generation of +− charge of the p-type $In_yGa_{1-y}N$ layer 13.

The doping effect of Mg in the p-type $In_yGa_{1-y}N$ layer 13 contributes to deplete the 2DEG 17 by lifting up the conduction band further as a result of negative ionization of Mg (hole emission).

Figure 5:
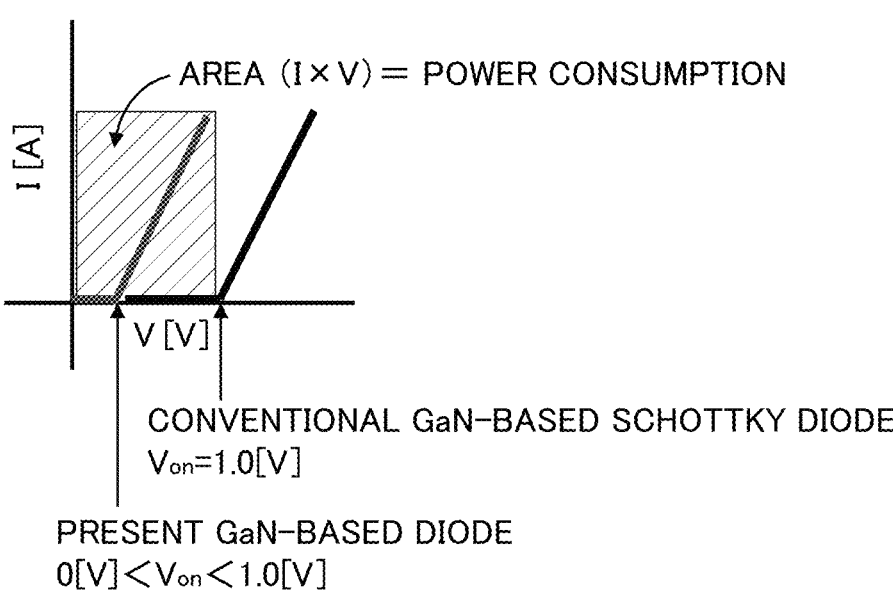
FIG. 5 A schematic view showing the current-voltage characteristic of the GaN-based diode according to the first embodiment of the invention.

The forward turn-on voltage (on voltage) $V_{on}$ of the GaN-based diode is determined by design in the range of 0 [V]$<V_{on}<$1.0 [V]. That is, $V_{on}$ is desired to be low because power loss (conduction loss) becomes small as shown in FIG. 5 which will be described later. $V_{on}$ of general GaN-based Schottky diodes is about 1.0 [V], therefore $V_{on}$ lower than this is desired. That is, in order to realize 0 [V]$<V_{on}<$1.0 [V], x and the thickness $t_{Al}$ of the $Al_xGa_{1-x}N$ layer 12 and y, the thickness $t_{In}$ and the Mg concentration [Mg] of the p-type $In_yGa_{1-y}N$ layer 13 are experimentally obtained.

[Operation of the GaN-Based Diode]

Operation of the GaN-based diode is described.

FIG. 5 shows the current (I)-voltage (V) characteristic of the GaN-based diode. As shown in FIG. 5, the forward turn-on voltage $V_{on}$ is 0 [V]$<V_{on}<$1.0 [V], preferably 0 [V]$<V_{on}<$0.8 [V] and more preferably 0 [V]$<V_{on}<$0.4 [V]. In FIG. 5, the current-voltage characteristic of the conventional GaN-based Schottky diode is also shown for comparison. $V_{on}$ of the conventional GaN-based Schottky diode is about 1.0 [V]. In FIG. 5, the area (I×V) represents power consumption and the area (I×$V_{on}$) of the area (I×V) represents power loss. Therefore, if $V_{on}$ is small, power loss is small and thereby power consumption can be decreased. Therefore, it is possible to decrease power loss of the GaN-based diode than the conventional GaN-based Schottky diode and decrease power consumption. As a result, a high efficiency GaN-based diode can be obtained.

[Method for Manufacturing the GaN-Based Diode]

As an example, a method for manufacturing the GaN-based diode having the structure shown in FIG. 3 is described. The GaN-based diode can be easily manufactured by conventionally known manufacturing methods. The GaN-based diode having the structure shown in FIG. 2 can also be easily manufactured by conventionally known manufacturing methods.

Figure 6A:
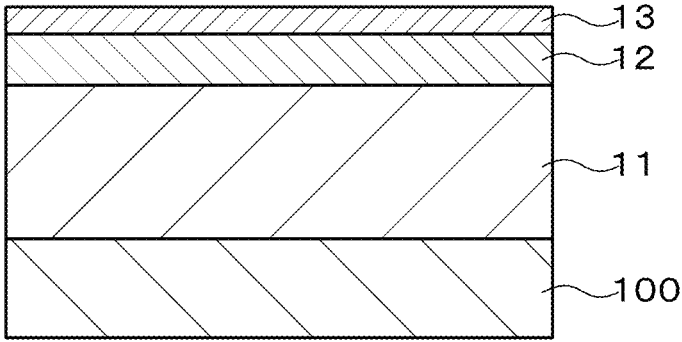
FIG. 6A A cross-sectional view showing a method for manufacturing the GaN-based diode according to the first embodiment of the invention.

As shown in FIG. 6A, by the conventionally known MOCVD (metal organic chemical vapor deposition) method, the undoped GaN layer 11, the $Al_xGa_{1-x}N$ layer 12 and the p-type $In_yGa_{1-y}N$ layer 13 are grown in order on the whole surface of a base substrate 100. As the base substrate 100, general substrates which have been conventionally used to grow GaN layers, for example, a C-plane sapphire substrate, a Si substrate, a SiC substrate and the like can be used.

Figure 6B:
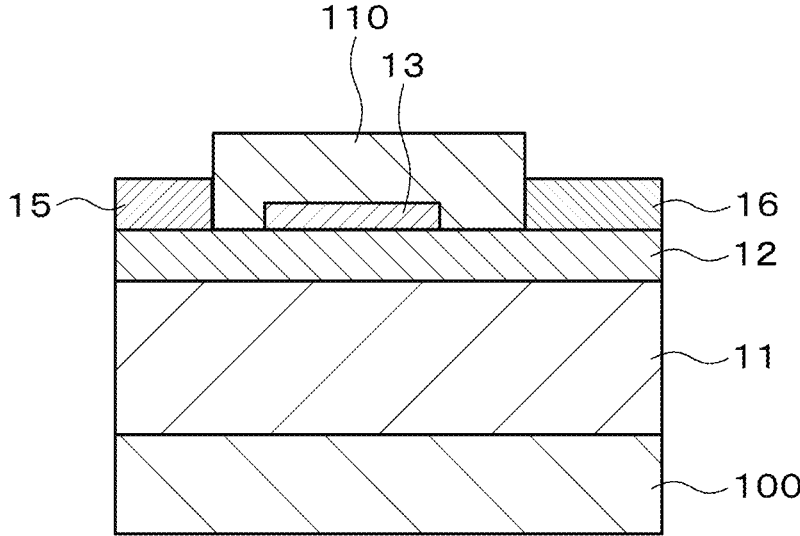
FIG. 6B A cross-sectional view showing the method for manufacturing the GaN-based diode according to the first embodiment of the invention.

Then, as shown in FIG. 6B, the p-type $In_yGa_{1-y}N$ layer 13 is patterned into a finger-like (stripe-like) shape. Patterning can be carried out by, for example, photoelectrochemical etching. As etchant, a solution in which potassium peroxodisulfate ($K_2S_2O_8$) is added to KOH solution as additive is used. Etching is carried out by irradiating ultraviolet rays having the wavelength of 260 nm to the etchant. The etching rate is about 20 nm/s. Then, a mask layer 110 made of $SiO_2$ having the predetermined shape is formed such that it covers the p-type $In_yGa_{1-y}N$ layer 15 and the surface of the areas of the $Al_xGa_{1-x}N$ layer 12 on which the anode electrode 15 and the cathode electrode 16 are to be formed exposes. The mask layer 110 can be formed by, for example, forming a $SiO_2$ film on the whole surface and then the $SiO_2$ film is patterned by etching. Then, a resist pattern (not illustrated) having openings corresponding to areas on which the anode electrode 15 and the cathode electrode 16 are to be formed is formed. Then a Ti film, an Al film, a Ni film and a Au film, for example, are formed in order on the whole surface of the substrate by a vacuum evaporation method and thereafter the resist pattern is removed together with the Ti/Al/Ni/Au layered film formed thereon (lift off) to form the anode electrode 15 and the cathode electrode 16 on parts of the $Al_xGa_{1-x}N$ layer 12 on both sides of the p-type $In_yGa_{1-y}N$ layer 13. Thereafter, rapid thermal annealing (RTA) of 700° C. and 60 seconds in nitrogen ($N_2$) gas atmosphere is carried out and the anode electrode 15 and the cathode electrode 16 are brought into ohmic contact with the 2 DEG 17 via the $Al_xGa_{1-x}N$ layer 12.

Figure 6C:
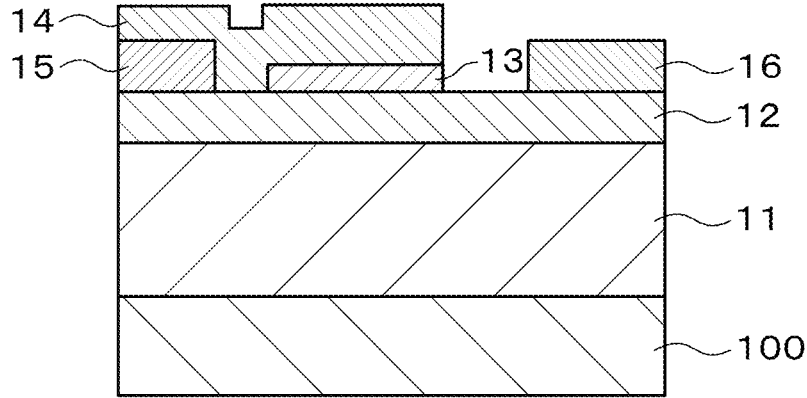
FIG. 6C A cross-sectional view showing the method for manufacturing the GaN-based diode according to the first embodiment of the invention.
Figure 7:
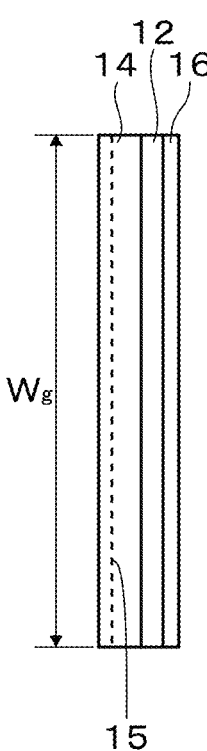
FIG. 7 A plan view showing the method for manufacturing the GaN-based diode according to the first embodiment of the invention.

Then, as shown in FIG. 6C, after the mask layer 110 is removed by etching, a resist pattern (not illustrated) having openings corresponding to a finger-shaped area including the anode electrode 15 and the p-type $In_yGa_{1-y}N$ layer 13 is formed, then a Ti film and a Ni film are formed in order on the whole surface of the substrate by the vacuum evaporation method and thereafter the resist pattern is removed together with the Ti/Ni layered film formed thereon (lift off) to form the finger-shaped metal electrode 14 which extends on the p-type $In_yGa_{1-y}N$ layer 13 and the anode electrode 15. Thereafter, RTA of 500° C. and 60 seconds in $N_2$ gas atmosphere is carried out. FIG. 7 shows a plan view of one finger in this state.

Examples of sizes and the like of each part of the GaN-based diode manufactured as described above are as follows. The thickness of the undoped GaN layer 11 is 2 [μm]. The thickness and x of the $Al_xGa_{1-x}N$ layer 12 are 20 [nm] and 0.21, respectively. The thickness, y and [Mg] of the p-type $In_yGa_{1-y}N$ layer 13 are 5 [nm], 0.2 and [Mg]=$1×10^{20}$ [cm$^{-3}$], respectively. The width of the anode electrode 15 is 1 [μm]. The finger length $L_g$ of the p-type $In_yGa_{1-y}N$ layer 13 is 1 [μm]. The width of the cathode electrode 16 is 2 [μm]. The width of the gap between the anode electrode 15 and the p-type $In_yGa_{1-y}N$ layer 13 is 1 [μm]. The width of the gap between the cathode electrode 16 and the p-type $In_yGa_{1-y}N$ layer 13 is 1 [μm]. The finger width $W_g$ of the anode electrode 15, the p-type $In_yGa_{1-y}N$ layer 13 and the cathode electrode 16 is 0.1 [mm] (100 [μm]).

Figure 8:
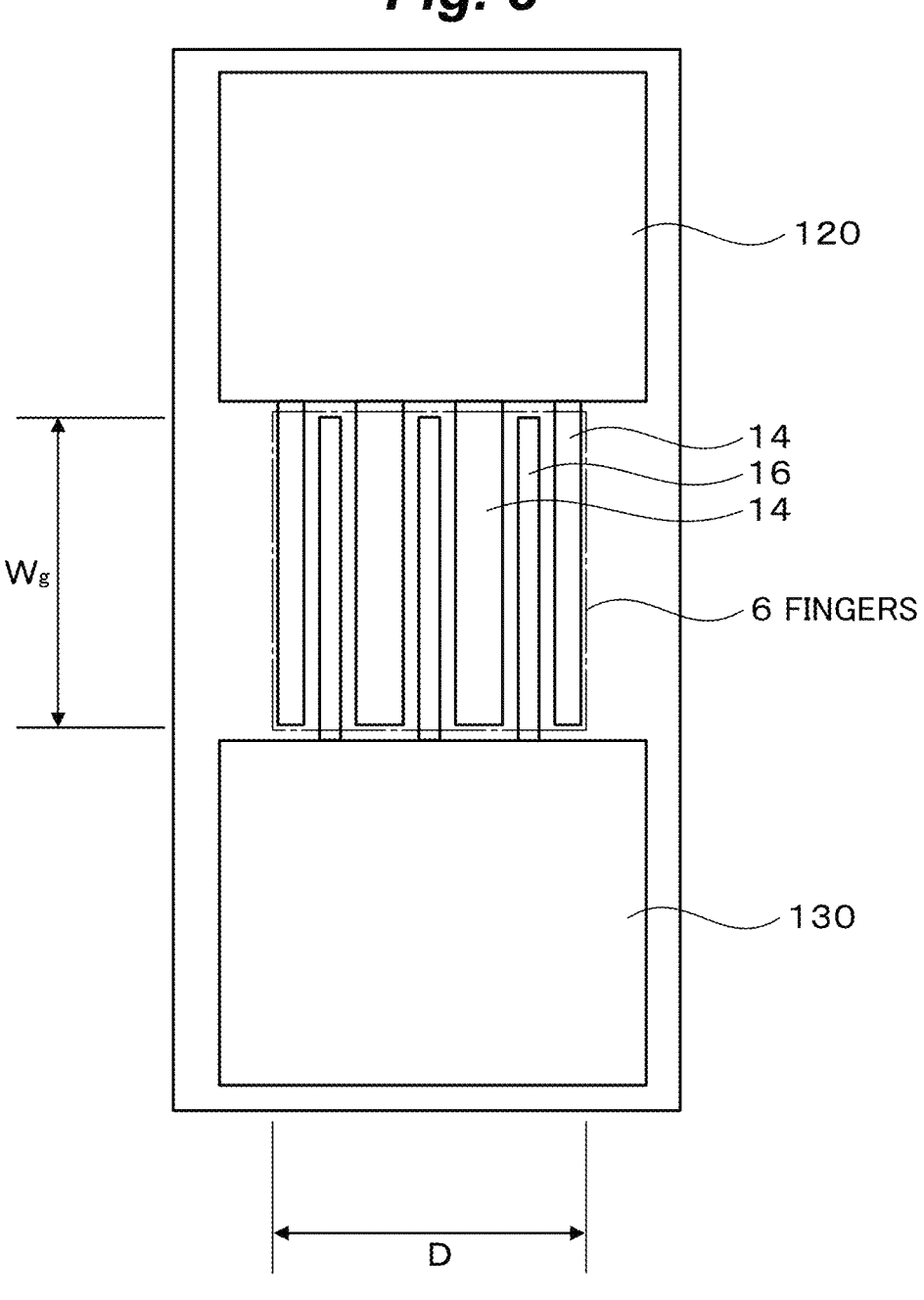
FIG. 8 A plan view showing a GaN-based diode chip manufactured by the method for manufacturing the GaN-based diode according to the first embodiment of the invention.

FIG. 8 shows an example of the GaN-based diode chip finally manufactured. The GaN-based diode chip is made of six fingers, each finger being the GaN-based diode shown in FIG. 7. The anode electrode 15 and the cathode electrode 16 are formed in a comb-like shape. In this case, four lines of the anode electrode 15 and three lines of the cathode electrode 16 are formed. An anode pad electrode 120 is provided such that it is connected to an end of each anode electrode 15. A cathode pad electrode 130 is provided such that it is connected to an end of each cathode electrode 16. The anode pad electrode 120 and the cathode pad electrode 130 can be formed, for example, by removing parts of the $Al_xGa_{1-x}N$ layer 12 below them, forming a $SiO_2$ film thereon and forming a Au film thereon by the vacuum evaporation method and the like. The total width D of six fingers is, for example, 0.035 [mm] (35 [μm]).

[Relation Between the Structure of the GaN-Based Diode and Electric Characteristics]

1. Diode Capacitance

The capacitance of the conventional Schottky diode is considered to be the sum of the capacitance of the part of parallel plates carried by the depletion layer below the Schottky electrode (parallel plate capacitance) (ε/d)S(ε:permittivity, S:area, d: depletion-layer width) and the fringe capacitance which occurs in the part in which the depletion layer is in contact with carriers(electron) in the lateral direction.

The GaN-based diode having the structure shown in FIG. 2 is now considered. If the capacitance of the GaN-based diode is considered to be composed of the parallel plate capacitance and the fringe capacitance similarly, the parallel plate capacitance can be almost ignored because there are essentially no carriers below the p-type $In_yGa_{1-y}N$ layer 13 and the metal electrode 14 and the parallel plate capacitance is scarcely formed. As a result, the capacitance of the GaN-based diode is considered to be only the fringe capacitance which occurs in an overlapped part of the edge of the p-type $In_yGa_{1-y}N$ layer 13 and the metal electrode 14 and the 2 DEG 17 extending from the side of the cathode electrode 16.

2. Numerical Calculation

Figure 9A:
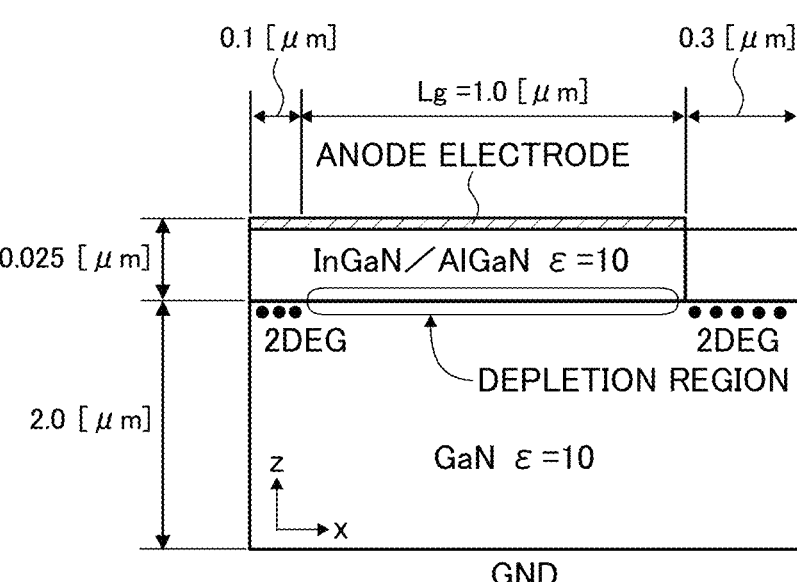
FIG. 9A A cross-sectional view showing a diode structure for numerical calculation used in the simulation carried out to obtain the capacitance of the GaN-based diode according to the first embodiment of the invention.
Figure 9B:
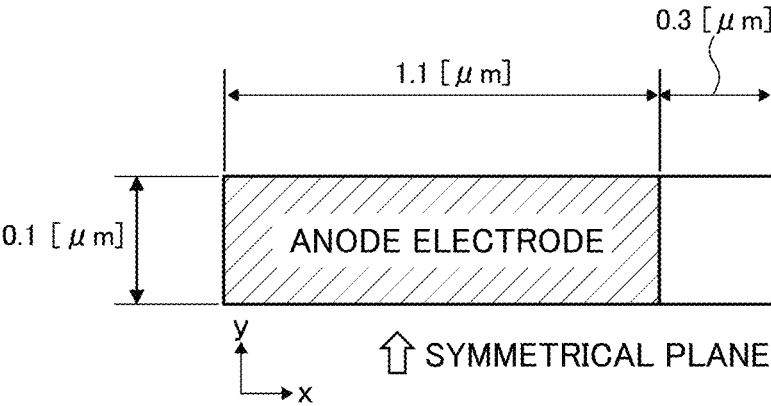
FIG. 9B A plan view showing the diode structure for numerical calculation used in the simulation carried out to obtain the capacitance of the GaN-based diode according to the first embodiment of the invention.

Simulation was carried out to obtain the capacitance of the GaN-based diode. FIG. 9A and FIG. 9B show the diode structure used for calculation of the capacitance. Here, FIG. 9A is a cross-sectional view and FIG. 9B is a plan view. Specifically, the thickness of the AlGaN layer of the standard AlGaN/GaN HEMT is 20~40 [nm]. Therefore, the total thickness of the p-type $In_yGa_{1-y}N$ layer 13 and the $Al_xGa_{1-x}N$ layer 12 was set to be 25 [nm] (0.025 [μm]). In FIG. 9A, the p-type $In_yGa_{1-y}N$ N layer 13 and the $Al_xGa_{1-x}N$ layer 12 are written as InGaN/AlGaN. The finger length $L_g$ of the p-type $In_yGa_{1-y}N$ layer 13 was set to be 1.0 [μm]. A channel of the 2 DEG 17 exists below 25 [nm] from the surface of the p-type $In_yGa_{1-y}N$ layer 13 and it is considered that this channel is in ohmic contact with the cathode electrode 16 (not illustrated in FIG. 9A and FIG. 9B). It is also considered that the 2 DEG 17 on the side of the anode electrode 15 is in ohmic contact with the anode electrode 15. In FIG. 9A and FIG. 9B, the whole of the anode electrode 15 and the metal electrode 14 is shown as the anode electrode. The thickness of the undoped GaN layer 11, which is written in FIG. 9A simply as GaN, was set to 2.0 [μm]. Permittivities of the undoped GaN layer 11, the $Al_xGa_{1-x}N$ layer 12 and the p-type $In_yGa_{1-y}N$ layer 13 were set to be ε=10. Rectangular coordinate system (x, y, z) was set as shown in FIG. 9A and FIG. 9B. A symmetrical plane was set in the (x-z) plane (cross-section). Therefore, the calculation result is proportional to the length in the y direction.

Figure 10:
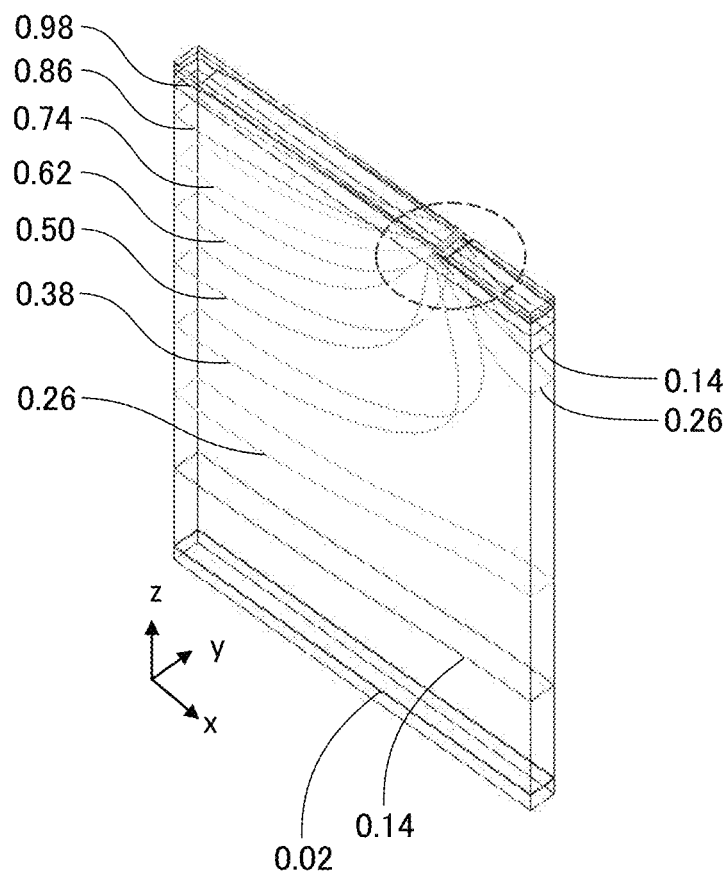
FIG. 10 A schematic view showing the potential distribution obtained by carrying out numerical calculation using the diode structure for numerical calculation shown in FIG. 9A and FIG. 9B.
Figure 11:
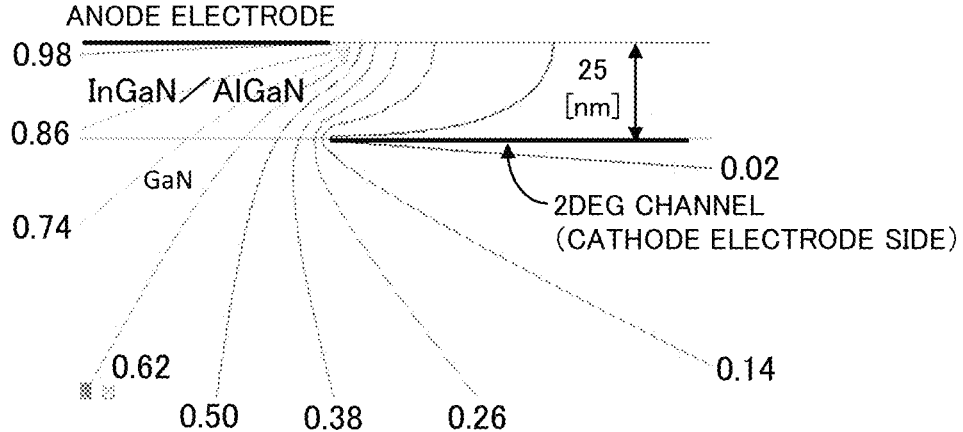
FIG. 11 A schematic view showing an enlargement view of a part of the potential distribution obtained by carrying out numerical calculation using the diode structure for numerical calculation shown in FIG. 9A and FIG. 9B.

FIG. 10 shows the potential distribution of the GaN-based diode obtained by calculation. FIG. 11 shows an enlargement view of a part (part surrounded by a broken line circle) of FIG. 10. In FIG. 10 and FIG. 11, equipotential lines when 1 [V] is applied to the anode electrode and 0 [V] is applied to the cathode electrode are illustrated at 0.12 [V] intervals. It is understood from FIG. 10 that the potential below the anode electrode has a uniform distribution along the x-axis direction. As shown in FIG. 10 and FIG. 11, the potential abruptly changes near the edge of the anode electrode and the edge of the 2 DEG channel and therefore it is understood that the fringe capacitance exists in this part. Its capacitance is as follows.

The area of the diode calculated was 0.1 [μm$^2$] (0.1 [μm]×1.0 [μm]) and the capacitance $C_0$ at 0 [V]-bias was $2.408×10^{-5}$ [pF]. When the diode is enlarged in the y direction and the area is enlarged to 1000 [μm$^2$] (1×100 [μm$^2$]×10 lines), the capacitance becomes 0.241 [pF]. The GaN-based Schottky diode described in non-patent literature 1 was used as a comparative example. When the above capacitance is compared with the measured capacitance reported in non-patent literature 1, it is about 7.5%. Further, when the above capacitance is compared with the capacitance 1.77 [pF] obtained by calculation in non-patent literature 1, it is about 14%. In both cases, the capacitance $C_0$ at 0 [V]-bias was drastically decreased.

11

12

3. Consideration of the Channel Resistance R

An index of speed of the diode is the time constant $C_0R[s]$. Here, R is on resistance. The on resistance R is estimated. The concentration n of the 2 DEG 17 is n~$1\times10^{13}$ [$cm^{-2}$] and the mobility $\mu$~1000 [$cm^2/Vs$]=$1\times10^3$ [$cm^2/Vs$]. The sheet resistance $R_s$ can be calculated by $1/(ne\mu)$ (where e denotes unit charge and is $1.6\times10^{-19}$ [C]) as follows.

$$R_s = 1/(ne\mu) = 1/\left(1 \times 10^{13} \times 1.6 \times 10^{-19} \times 1 \times 10^3\right)$$
$$= 1/\left(1.6 \times 10^{-3}\right)$$
$$= 625[\Omega/\square]$$

The effective finger width of the GaN-based diode was set as $W_g$=1000 [$\mu$m] as the same as non-patent literature 1. Therefore, the channel resistance R is as follows.

$$R=R_s\times(L_g/W_g)=(625\times1)/1000=0.625[\Omega]$$

Accordingly, the CR product of the GaN-based diode becomes as follows.

$$CR=3.2\ [pF]\times0.625[\Omega]=0.151[ps]$$

On the other hand, with respect to the CR product of the GaN-based Schottky diode described in non-patent literature 1, the measured value was $$CR=3.2\ [pF]\times4.3[\Omega]=13.7[ps]$$

and the calculated value was $$CR=1.77\ [pF]\times4.3[\Omega]=7.61[ps]$$

Both values are 50~90 times as large as the CR product of the GaN-based diode.

From the above, the GaN-based diode is 50~90 times as fast as the GaN-based Schottky diode described in non-patent literature 1. In addition to this, the channel resistance R of the GaN-based diode is 0.625[$\Omega$] and the channel resistance R of the GaN-based Schottky diode described in non-patent literature 1 is 4.3[$\Omega$]. Therefore, the GaN-based diode can flow current 4.3[$\Omega$]/0.625[$\Omega$]=6.9 times as much as the Schottky diode described in non-patent literature 1.

Described is the result of verification of band pulling up effect by the p-type $In_yGa_{1-y}N$ layer 13, which was described in connection with FIG. 4B.

Grown on a sapphire substrate in order by the MOCVD method were an undoped GaN layer having a thickness of 2 [$\mu$m] and an undoped $Al_xGa_{1-x}N$ layer having a thickness of 20 [nm] and x=0.21. The sheet resistance of the epitaxial substrate obtained in this way was measured by eddy current method. The sheet resistance was 618 [$\Omega/\square$] on the average. Since the mobility $\mu$~1000 [$cm^2/Vs$], the concentration of the 2 DEG 17 was about $1\times10^{13}$ [$cm^{-2}$].

The p-type $In_yGa_{1-y}N$ layer 13 was further grown on the epitaxial substrate by the MOCVD method. With respect to the p-type $In_yGa_{1-y}N$ layer 13, the In composition y=0.20, the thickness $t_{In}$=5 [nm] and [Mg]=$1\times10^{20}$ [$cm^{-3}$]. The sheet resistance of the epitaxial substrate was measured. The result was 180 [k$\Omega$] on the average, which is near to measurement limit. The highest value was 1.1 [M$\Omega$], which exceeds rated measurement limit. This shows that the 2 DEG 17 was depleted by stacking of the p-type $In_yGa_{1-y}N$ layer 13.

As described above, according to the first embodiment, since the island-like p-type $In_yGa_{1-y}N$ layer 13 is provided on the $Al_xGa_{1-x}N$ layer 12 and the metal electrode 14 is provided on the p-type $In_yGa_{1-y}N$ layer 13, the 2DEG 17 formed in the undoped GaN layer 12 in the vicinity part of the hetero-interface between the undoped GaN layer 11 and the $Al_xGa_{1-x}N$ layer 12 is depleted in the part below the p-type $In_yGa_{1-y}N$ layer 13 at a non-operating time. Therefore, the capacitance of the GaN-based diode at 0 [V]-bias is substantially only the fringe capacitance. Accordingly, it is possible to drastically decrease the capacitance compared with the conventional GaN-based Schottky diode and to realize ultrahigh speed of the GaN-based diode. Since the metal electrode 14 and the anode electrode 15 are electrically connected each other, it is possible to easily realize the GaN-based diode having the forward turn-on voltage $V_{on}$ of 0 [V] <$V_{on}$<1.0 [V], for example 0.3 V, which is lower than the conventional GaN-based Schottky diode. Since $V_{on}$ can be decreased, it is possible to decrease the power loss. Since the power loss can be decreased, it is possible to realize the high efficiency GaN-based diode. Further, the GaN-based diode has high voltage resistance. By using the high efficiency, high speed, high voltage resistance GaN-based diode as a rectifier diode, it is possible to improve performance of the high-frequency radio wave power reception device and power transmission system.

The Second Embodiment

[The GaN-Based Diode]

Figure 12:
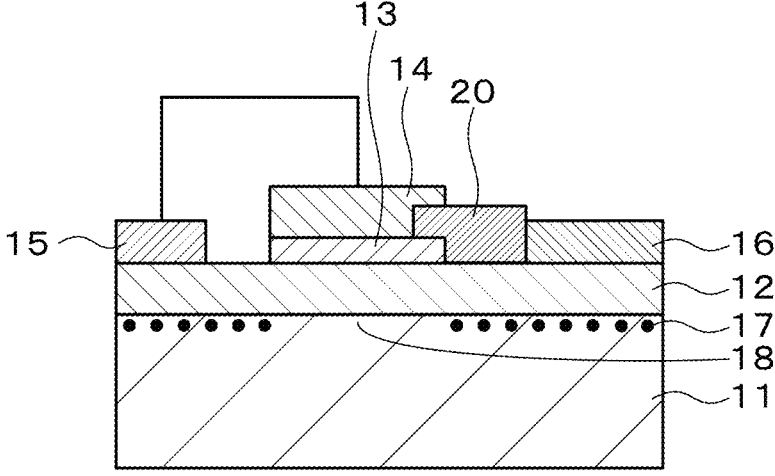
FIG. 12 A cross-sectional view showing the basic structure of a GaN-based diode according to a second embodiment of the invention.

The GaN-based diode according to the second embodiment is described. FIG. 12 shows the basic structure of the GaN-based diode.

Figure 13:
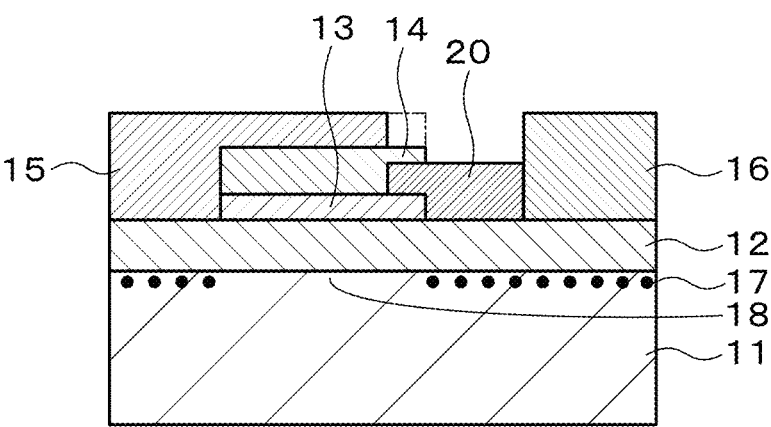
FIG. 13 A cross-sectional view showing a specific example of the way of connection between the anode electrode and the metal electrode of the GaN-based diode according to the second embodiment of the invention.
Figure 14:
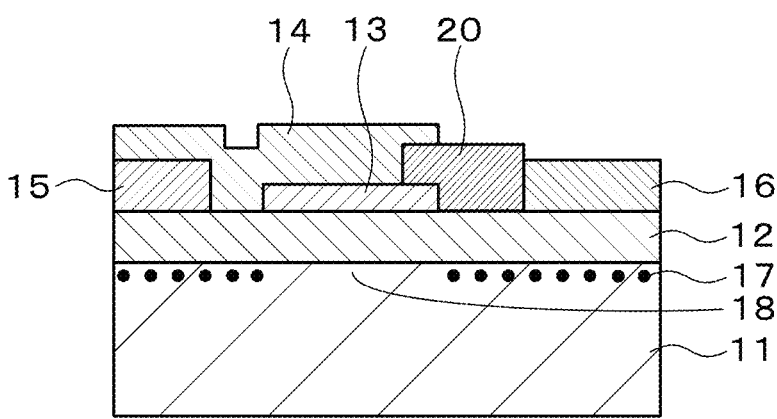
FIG. 14 A cross-sectional view showing another example of the way of connection between the anode electrode and the metal electrode of the GaN-based diode according to the second embodiment of the invention.
Figure 15:
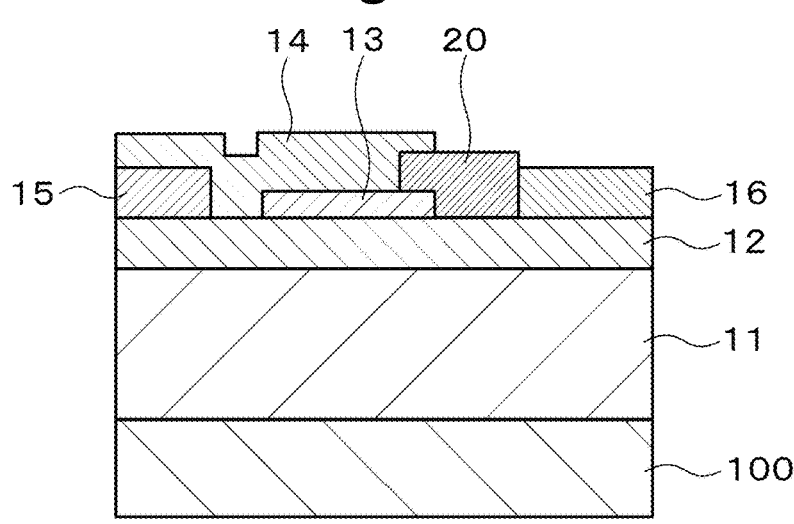
FIG. 15 A cross-sectional view showing a method for manufacturing the GaN-based diode according to the second embodiment of the invention.

As shown in FIG. 12, in the GaN-based diode, an insulating layer 20 is provided between the edge of the metal electrode 14 on the side of the cathode electrode 16 such that it extends on the part of the $Al_xGa_{1-x}N$ layer 12 between the p-type $In_yGa_{1-y}N$ layer 13 and the cathode electrode 16. Insulator forming the insulating layer 20 is not particularly limited and selected as necessary and is, for example, $SiO_2$. The thickness of the insulating layer 20 is selected as necessary, for example selected to be not smaller than 0.1 [$\mu$m] and not larger than 0.4 [$\mu$m]. In this case, the distance between the edge of the metal electrode 14 on the side of the cathode electrode 16 is longer than that of the GaN-based diode according to the first embodiment by the thickness of the insulating layer 20. Therefore, it is possible to decrease the fringe capacitance of the part between the edge of the metal electrode 14 on the side of the cathode electrode 16 and the edge of the 2 DEG 17. In this case, the part of the metal electrode 14 on the side of the cathode electrode 16 acts as a kind of field plates. Others are the same as those of the GaN-based diode according to the first embodiment. FIG. 13 and FIG. 14 show examples shown in FIG. 2 and FIG. 3 in which the insulating layer 20 is provided, respectively.

[Method for Manufacturing the GaN-Based Diode]

As an example, a method for manufacturing the GaN-based diode having the structure shown in FIG. 14 is described.

In the manufacturing method of the GaN-based diode, processes are carried out as the same as the manufacturing method of the GaN-based diode according to the first embodiment and the anode electrode 15 and the cathode electrode 16 are formed and then the mask layer 110 is removed by etching.

Then, for example, a $SiO_2$ film is formed on the whole surface and then the $SiO_2$ film is patterned by etching to form the insulating layer 20.

Then, a resist pattern (not illustrated) having openings corresponding to the finger-like area including the end of the anode electrode 15, the p-type $In_yGa_{1-y}N$ layer 13 and the insulating layer 20 on the side of the anode electrode 15 is formed. Then a Ti film and a Ni film are formed in order on the whole surface of the substrate by the vacuum evaporation method and thereafter the resist pattern is removed together with the Ti/Ni layered film formed thereon (lift off) to form the finger-like metal electrode 14 extending on the edge of the anode electrode 15, the p-type $In_yGa_{1-y}N$ layer 13 and the insulating layer 20 on the side of the anode electrode 15. Thereafter, RTA of 500° C. and 60 seconds in $N_2$ gas atmosphere was carried out. In this way, the GaN-based diode is manufactured.

Examples of sizes and the like of each part of the GaN-based diode manufactured as described above are as follows. The thickness of the undoped GaN layer 11 is 2 [μm]. The thickness and x of the $Al_xGa_{1-x}N$ layer 12 are 20 [nm] and 0.21, respectively. The thickness, y and [Mg] of the p-type $In_yGa_{1-y}N$ layer 13 are 5 [nm], 0.2 and $[Mg]=1×10^{20}$ $[cm^{-3}]$. The width of the anode electrode 15 is 2 [μm]. The finger length $L_g$ of the p-type $In_yGa_{1-y}N$ layer 13 is 1 [μm]. The width of the cathode electrode 16 is 3 [μm]. The width of the gap between the anode electrode 15 and the p-type $In_yGa_{1-y}N$ layer 13 is 1 [μm]. The width of the gap between the cathode electrode 16 and the p-type $In_yGa_{1-y}N$ layer 13 is 1 [μm]. The finger width $W_g$ of the anode electrode 15, the p-type $In_yGa_{1-y}N$ layer 13 and the cathode electrode 16 is 0.1 [mm] (100 [μm]). The thickness of the part of the insulating layer 20 between the edge of the metal electrode 14 on the side of the cathode electrode 16 and the p-type $In_yGa_{1-y}N$ layer 13 is 0.2 [μm]. The width of the part of the p-type $In_yGa_{1-y}N$ layer 13 is 0.3 [μm].

[Characteristics of the GaN-Based Diode]

Figure 16A:
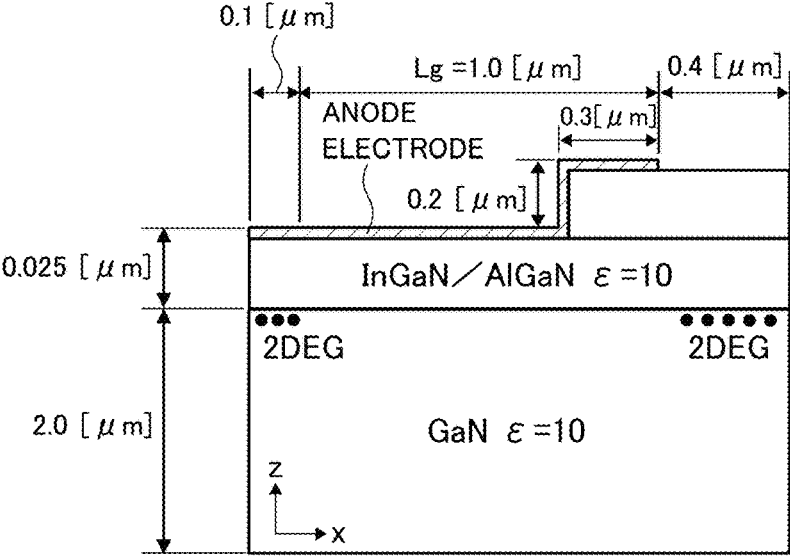
FIG. 16A A cross-sectional view showing a diode structure for numerical calculation used in the simulation carried out to obtain the capacitance of the GaN-based diode according to the second embodiment of the invention.
Figure 16B:
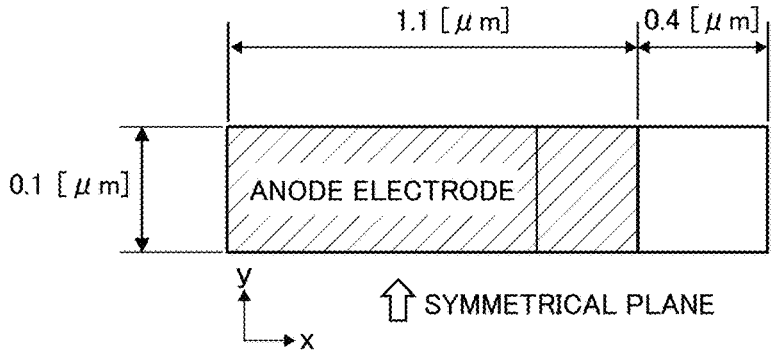
FIG. 16B A plan view showing the diode structure for numerical calculation used in the simulation carried out to obtain the capacitance of the GaN-based diode according to the second embodiment of the invention.

With respect to the diode structure shown in FIG. 16A and FIG. 16B, the capacitance was calculated by setting conditions as the same as the diode structure shown in FIG. 9A and FIG. 9B. Here, FIG. 16A is s cross-sectional view and FIG. 16B is a plan view.

Figure 17:
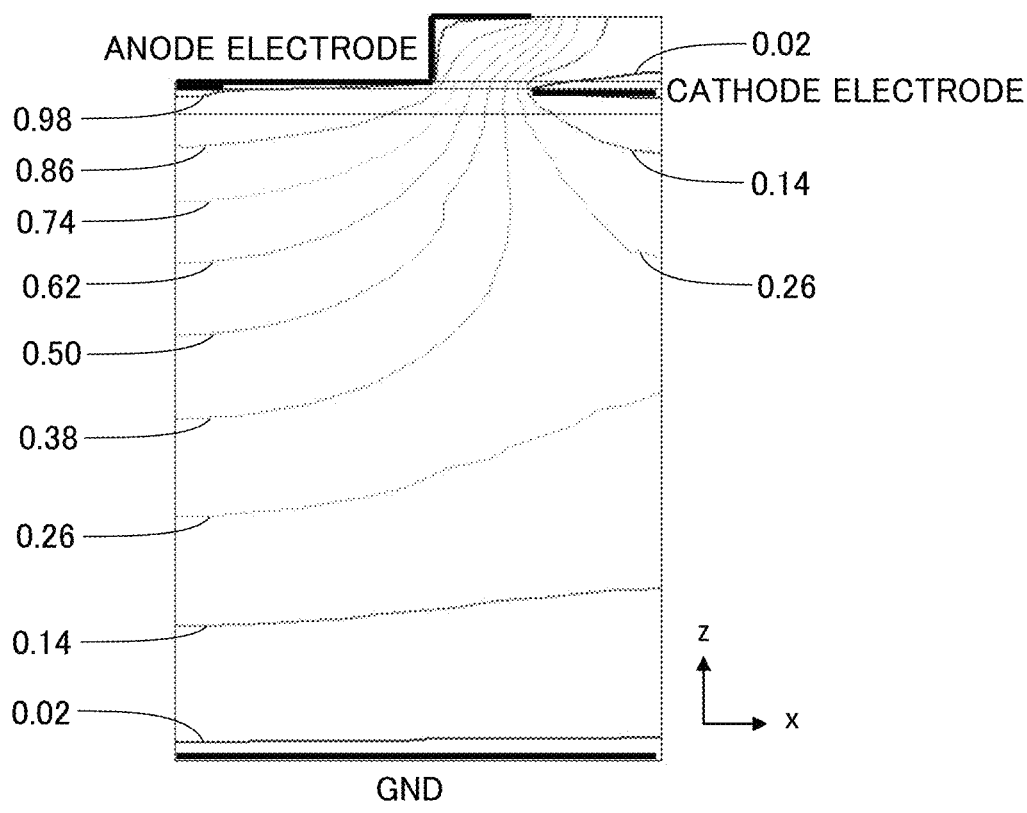
FIG. 17 A schematic view showing the potential distribution obtained by carrying out numerical calculation using the diode structure for numerical calculation shown in FIG. 16A and FIG. 16B.
Figure 18:
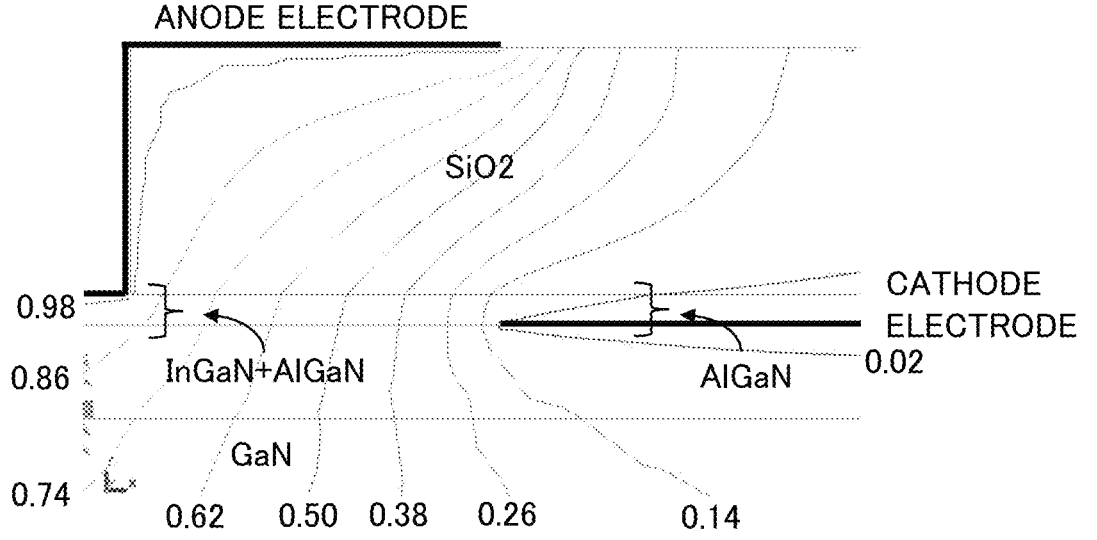
FIG. 18 A schematic view showing an enlargement view of a part of the potential distribution obtained by carrying out numerical calculation using the diode structure for numerical calculation shown in FIG. 16A and FIG. 16B.

FIG. 17 shows the potential distribution obtained by calculation. FIG. 18 shows an enlargement view of a part of FIG. 17. Equipotential lines in FIG. 17 and FIG. 18 are the same as the diode structure shown in FIG. 9A and FIG. 9B. The potential below the anode electrode 15 distributes uniformly along the x-axis direction as the same as the diode structure shown in FIG. 9A and FIG. 9B. It is understood from FIG. 17 and FIG. 18 that in the enlargement view of the potential distribution near the edge of the anode electrode 15 and the edge of 2 DEG 17, the potential abruptly changes and this shows that the fringe capacitance exists. In the structure, the capacitance was $1.33×10^{-5}$ [pF] for the finger length $L_g=1$ [μm]. For the finger length $L_g=100$ [μm], the capacitance was $1.33×10^{-2}$ [pF], which is one thousand times as large as the former. When six fingers are used and the area is increased six times to make the area of the GaN-based diode as the same as the area of the GaN-based Schottky diode described in non-patent literature 1, $C_0$ becomes 6 times $1.33×10^{-2}$ [pF], that is 0.080 [pF]. The channel resistance R is decreased to ⅙ and is 2.2[Ω]. Therefore, the time constant $C_0R$ is 0.080 [pF]×2.2[Ω]=0.17 [ps]. The time constant is about 1/100 of the time constant of the GaN-based Schottky diode described in non-patent literature 1 and is very small.

According to the second embodiment, since the insulating layer 20 is provided between the edge of the metal electrode 14 on the side of the cathode electrode 16 and the p-type $In_yGa_{1-y}N$ layer 13, it is possible to further decrease the capacitance compared with the first embodiment, and finally realize the faster GaN-based diode. By using the high efficiency, high speed, high voltage resistance GaN-based diode as a rectifier diode, it is possible to realize the high performance power reception device and power transmission system.

The Third Embodiment

[The Power Reception Device]

The power reception device according to the third embodiment is described. In the power reception device, a rectenna circuit is used for a power reception circuit.

Figures 19, 20:
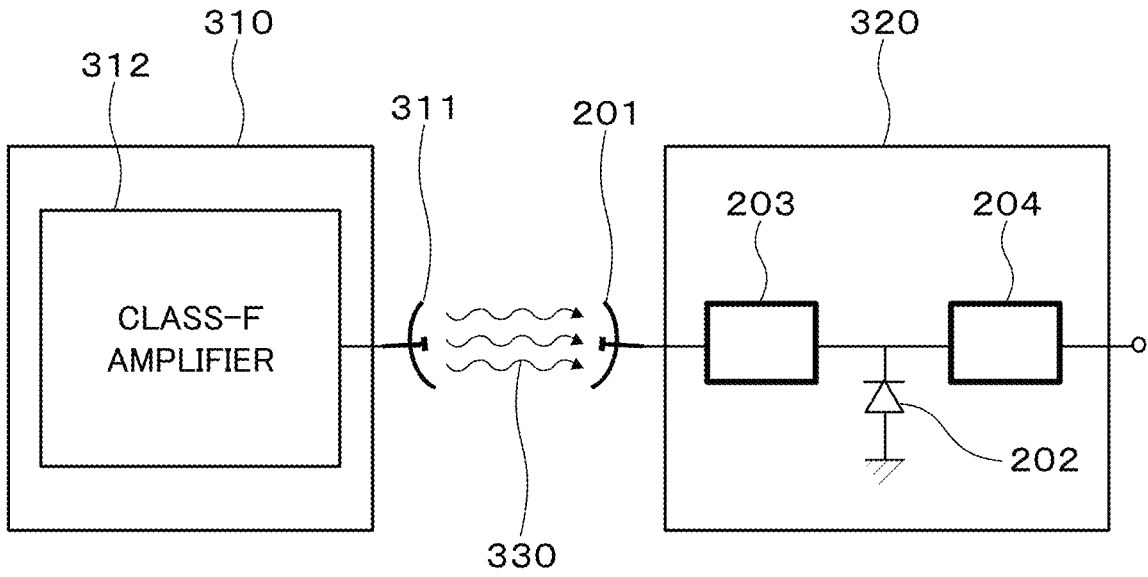
FIG. 19 A schematic view showing a power reception device according to a third embodiment of the invention.
FIG. 20 A schematic view showing a power transmission system according to a fourth embodiment of the invention.

FIG. 19 shows the power reception device. As shown in FIG. 19, the power reception device has a rectenna circuit including an antenna 201 for receiving a high-frequency radio wave, a rectifier diode 202 and matching circuits 203, 204 for carrying out higher harmonics matching in which impedance of harmonic frequency is changed to a desired value. The antenna 201 is not particularly limited and selected as necessary and is, for example, a dipole antenna. The rectifier diode 202 is constituted of the GaN-based diode according to the first or second embodiment.

According to the third embodiment, since the GaN-based diode according to the first or second embodiment used as the rectifier diode 202 attains high speed operation, high efficiency and low power consumption as described in the first or second embodiment, it is possible to realize the low power consumption and high performance power reception device.

The Fourth Embodiment

[The Power Transmission System]

The power transmission system according to the fourth embodiment is described. In the power transmission system, the power reception device according to the third embodiment is used for a power reception circuit.

FIG. 20 shows the power transmission system. As shown in FIG. 20, the power transmission system has a power transmission circuit 310 for carrying out the DC/RF conversion in which direct current is converted to a high-frequency radio wave and a power reception circuit 320 for carrying out the RF/DC conversion in which a high-frequency radio wave is converted to direct current. As the power reception circuit 320, a rectenna circuit similar to the reception circuit of the power reception circuit according to the third embodiment is used. The power transmission circuit 310 has an antenna 311. The power transmission circuit 310 has a class F amplifier 312. As the class F amplifier 312, for example, an AlGaN/GaN HEMT is used.

A high-frequency radio wave 330 obtained by the DC/RF conversion is transmitted from the antenna 311 of the power transmission circuit 310. The high-frequency radio wave 330 is received by the antenna 201 of the power reception circuit 320 and converted to direct current by the RF/DC conversion by the rectenna circuit. In this way, the high-frequency radio wave power transmission is carried out from the power transmission circuit 310 to the power reception circuit 320.

According to the fourth embodiment, since the GaN-based diode according to the first or second embodiment used as the rectifier diode 202 attains high speed operation, high efficiency and low power consumption as described in the first or second embodiment, it is possible to realize the low power consumption and high performance power transmission system.

Heretofore, embodiments of the present invention have been explained specifically. However, the present invention is not limited to these embodiments, but contemplates various changes and modifications based on the technical idea of the present invention.

For example, numerical numbers, structures, shapes, materials and the like presented in the aforementioned embodiments are only examples, and the different numerical numbers, structures, shapes, materials and the like may be used as needed.

EXPLANATION OF REFERENCE NUMERALS

11 Undoped GaN layer
12 $Al_xGa_{1-x}N$ layer
13 p-type $In_yGa_{1-y}N$ layer
14 Metal electrode
15 Anode electrode
16 Cathode electrode
17 2 DEG
18 Depletion region
20 Insulating layer
100 Base substrate
110 Mask layer

The invention claimed is:

1. A diode, comprising:
an undoped GaN layer,
an $Al_xGa_{1-x}N$ layer (0<x<1) on the undoped GaN layer,
a Mg-doped p-type $In_yGa_{1-y}N$ layer (0<y<1) having an island-like shape on the $Al_xGa_{1-x}N$ layer,
a metal electrode which is provided on the whole surface of the p-type $In_yGa_{1-y}N$ layer and which is in contact with the p-type $In_yGa_{1-y}N$ layer,
an anode electrode which is provided on the $Al_xGa_{1-x}N$ layer such that the anode electrode extends from the $Al_xGa_{1-x}N$ layer on the metal electrode and which is electrically connected to the metal electrode; and
a cathode electrode which is provided on a part of the $Al_xGa_{1-x}N$ layer which is located on the opposite side from the anode electrode with respect to the p-type $In_yGa_{1-y}N$ layer, $0.1<x<0.3$ $10\ [nm]<t_{Al}<40\ [nm]$ $0.05<y<0.25$ $2\ [nm]<t_{In}<20\ [nm]$ $1\times10^{19}\ [cm^{-3}]<[Mg]<1\times10^{21}\ [cm^{-3}]$ being satisfied when the thickness of the $Al_xGa_{1-x}N$ layer is denoted as tai, the thickness of the p-type $In_yGa_{1-y}N$ layer is denoted as tin and the Mg concentration of the p-type $In_yGa_{1-y}N$ layer is denoted as [Mg],
a two-dimensional electron gas being formed in the undoped GaN layer in the vicinity part of a hetero-interface between the $Al_xGa_{1-x}N$ layer and the undoped GaN layer except a part below the p-type $In_yGa_{1-y}N$ layer and the two-dimensional electron gas being depleted to form the depletion region in the part below the p-type $In_yGa_{1-y}N$ layer at a non-operating time,
$0\ [V]<V_{on}<1.0\ [V]$ being satisfied when the forward turn-on voltage is denoted as $V_{on}$.

2. The diode according to claim 1 wherein an insulating layer is provided between the edge of the metal electrode on the side of the cathode electrode and the p-type $In_yGa_{1-y}N$ layer such that the insulating layer extends on a part of the $Al_xGa_{1-x}N$ layer which is located between the p-type $In_yGa_{1-y}N$ layer and the cathode electrode.

3. A power reception device, comprising:
a power reception circuit for receiving a high-frequency radio wave,
the power reception circuit having a rectifier diode for converting a high-frequency radio wave into direct current,
the rectifier diode being
a diode, comprising:
an undoped GaN layer,
an $Al_xGa_{1-x}N$ layer (0<x<1) on the undoped GaN layer,
a Mg-doped p-type $In_yGa_{1-y}N$ layer (0<y<1) having an island-like shape on the $Al_xGa_{1-x}N$ layer,
a metal electrode which is provided on the whole surface of the p-type $In_yGa_{1-y}N$ layer and which is in contact with the p-type $In_yGa_{1-y}N$ layer,
an anode electrode which is provided on the $Al_xGa_{1-x}N$ layer such that the anode electrode extends from the $Al_xGa_{1-x}N$ layer on the metal electrode and which is electrically connected to the metal electrode; and
a cathode electrode which is provided on a part of the $Al_xGa_{1-x}N$ layer which is located on the opposite side from the anode electrode with respect to the p-type $In_yGa_{1-y}N$ layer, $0.1<x<0.3$ $10\ [nm]<t_{Al}<40\ [nm]$ $0.05<y<0.25$ $2\ [nm]<t_{In}<20\ [nm]$ $1\times10^{19}\ [cm^{-3}]<[Mg]<1\times10^{21}\ [cm^{-3}]$ being satisfied when the thickness of the $Al_xGa_{1-x}N$ layer is denoted as $t_{Al}$, the thickness of the p-type $In_yGa_{1-y}N$ layer is denoted as tin and the Mg concentration of the p-type $In_yGa_{1-y}N$ layer is denoted as [Mg],
a two-dimensional electron gas being formed in the undoped GaN layer in the vicinity part of a hetero-interface between the $Al_xGa_{1-x}N$ layer and the undoped GaN layer except a part below the p-type $In_yGa_{1-y}N$ layer and the two-dimensional electron gas being depleted to form the depletion region in the part below the p-type $In_yGa_{1-y}N$ layer at a non-operating time,
$0\ [V]<V_{on}<1.0\ [V]$ being satisfied when the forward turn-on voltage is denoted as $V_{on}$.

4. A power transmission system, comprising:
a power transmission circuit for transmitting a high-frequency radio wave; and
a power reception circuit for receiving a high-frequency radio wave,
the power reception circuit having a rectifier diode for converting a high-frequency radio wave into direct current,
the rectifier diode being
a diode, comprising:
an undoped GaN layer,
an $Al_xGa_{1-x}N$ layer (0<x<1) on the undoped GaN layer,
a Mg-doped p-type $In_yGa_{1-y}N$ layer (0<y<1) having an island-like shape on the $Al_xGa_{1-x}N$ layer,
a metal electrode which is provided on the whole surface of the p-type $In_yGa_{1-y}N$ layer and which is in contact with the p-type $In_yGa_{1-y}N$ layer,
an anode electrode which is provided on the $Al_xGa_{1-x}N$ layer such that the anode electrode extends from the $Al_xGa_{1-x}N$ layer on the metal electrode and which is electrically connected to the metal electrode; and a cathode electrode which is provided on a part of the $Al_xGa_{1-x}N$ layer which is located on the opposite side from the anode electrode with respect to the p-type $In_yGa_{1-y}N$ layer, $0.1 < x < 0.3$ $10 \text{ [nm]} < t_{Al} < 40 \text{ [nm]}$ $0.05 < y < 0.25$ $2 \text{ [nm]} < t_{In} < 20 \text{ [nm]}$ $1 \times 10^{19} \text{ [cm}^{-3}] < [\text{Mg}] < 1 \times 10^{21} \text{ [cm}^{-3}]$ being satisfied when the thickness of the $Al_xGa_{1-x}N$ layer is denoted as $t_{Al}$, the thickness of the p-type $In_yGa_{1-y}N$ layer is denoted as tin and the Mg concentration of the p-type $In_yGa_{1-y}N$ layer is denoted as [Mg], a two-dimensional electron gas being formed in the undoped GaN layer in the vicinity part of a hetero-interface between the $Al_xGa_{1-x}N$ layer and the undoped GaN layer except a part below the p-type $In_yGa_{1-y}N$ layer and the two-dimensional electron gas being depleted to form the depletion region in the part below the p-type $In_yGa_{1-y}N$ layer at a non-operating time, $0 \text{ [V]} < V_{on} < 1.0 \text{ [V]}$ being satisfied when the forward turn-on voltage is denoted as $V_{on}$.

* * * * *